United States Patent
Shimizu et al.

(10) Patent No.: US 7,772,613 B2
(45) Date of Patent: Aug. 10, 2010

(54) SEMICONDUCTOR DEVICE WITH LARGE BLOCKING VOLTAGE AND METHOD OF MANUFACTURING THE SAME

(75) Inventors: Haruka Shimizu, Kodaira (JP); Natsuki Yokoyama, Mitaka (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 12/533,740

(22) Filed: Jul. 31, 2009

(65) Prior Publication Data
US 2010/0025739 A1 Feb. 4, 2010

(30) Foreign Application Priority Data
Aug. 4, 2008 (JP) ............... 2008-200397

(51) Int. Cl.
*H01L 29/80* (2006.01)
(52) U.S. Cl. ............... 257/135; 257/E29.198
(58) Field of Classification Search ......... 257/134–138, 257/E29.198, 510, 330, 297; 438/137–138, 438/268
See application file for complete search history.

(56) References Cited

U.S. PATENT DOCUMENTS

| | | | |
|---|---|---|---|
| 7,189,608 B2* | 3/2007 | Venkatraman et al. ...... 438/218 |
| 7,202,537 B2* | 4/2007 | Chidambaram et al. ..... 257/371 |
| 7,470,952 B2* | 12/2008 | Ruething et al. ............. 257/327 |
| 7,535,059 B2* | 5/2009 | Yoshikawa et al. .......... 257/341 |
| 7,579,642 B1* | 8/2009 | Bulucea ...................... 257/303 |
| 7,615,802 B2* | 11/2009 | Elpelt et al. ................. 257/135 |
| 2002/0139992 A1* | 10/2002 | Kumar et al. ................ 257/134 |
| 2003/0025152 A1* | 2/2003 | Werner et al. ............... 257/328 |
| 2005/0242370 A1* | 11/2005 | Weber et al. ................ 257/135 |
| 2009/0014719 A1* | 1/2009 | Shimizu et al. ............... 257/49 |

FOREIGN PATENT DOCUMENTS

| | | |
|---|---|---|
| JP | 2001-527296 A | 12/2001 |
| JP | 2004-134547 A | 4/2004 |
| WO | 99/33118 A1 | 7/1999 |

* cited by examiner

*Primary Examiner*—Nathan W Ha
(74) *Attorney, Agent, or Firm*—Mattingly & Malur, P.C.

(57) ABSTRACT

A normally-off type junction FET in which a channel resistance is reduced without lowering its blocking voltage is provided. In a junction FET formed with using a substrate made of silicon carbide, an impurity concentration of a channel region (second epitaxial layer) is made higher than an impurity concentration of a first epitaxial layer to be a drift layer. The channel region is formed of a first region in which a channel width is constant and a second region below the first region in which the channel width becomes wider toward the drain (substrate) side. A boundary between the first epitaxial layer and the second epitaxial layer is positioned in the second region in which the channel width becomes wider toward the drain (substrate) side.

15 Claims, 8 Drawing Sheets

SEMICONDUCTOR DEVICE WITH LARGE BLOCKING VOLTAGE AND METHOD OF MANUFACTURING THE SAME

CROSS-REFERENCE TO RELATED APPLICATION

The present application claims priority from Japanese Patent Application No. JP 2008-200397 filed on Aug. 4, 2008, the content of which is hereby incorporated by reference into this application.

TECHNICAL FIELD OF THE INVENTION

The present invention relates to a semiconductor device and a method of manufacturing the semiconductor device. More particularly, the present invention relates to a technique effectively applied to a semiconductor device having a junction FET using silicon carbide as its base material, and a method of manufacturing the semiconductor device.

BACKGROUND OF THE INVENTION

Specific on-resistance and blocking voltage of a semiconductor power device are defined by a bandgap of a semiconductor substrate (hereinafter, simply called "substrate") material, and they are in a trade-off relationship. Thus, to top the performance of silicon devices which have been widely used as power devices, it is effective to use substrate materials having a larger bandgap than silicon. Particularly, SiC (silicon carbide) has some advantages such as having a sufficiently-large bandgap about three times the bandgap of silicon, being easy to form p-type and n-type conductivities, and being capable of forming an oxide film by a thermal treatment. Therefore, SiC has been receiving much attention as it has potential for a high-performance MOSFET (metal oxide semiconductor field effect transistor).

However, there is a big problem in forming an oxide film on silicon carbide. That is, carbon remains in the oxide layer when silicon carbide is subjected to a heat treatment, resulting in formation of high-density interface states. Thereby, the channel mobility of the MOSFET is greatly degraded, and accordingly, the specific on-resistance is significantly increased. Also, carbon in the oxide film causes degradation of the oxide film reliability, which is a major barrier to forming the MOSFET.

Structures of a device avoiding the problem of the oxide film interface include the junction FET. The junction FET is a device of a type of taking a pn junction as its gate and controlling a channel, what is called "normally-on" type that is turned off by applying, normally, a negative voltage to the gate to extend the depletion layer in the channel. Since the normally-on type devices has limited usage in view of fail safe in case of having the gate failed in the ON state, the power devices are desired to be the normally-off type, generally. A junction FET of silicon cannot have a high blocking voltage when it is the normally-off type, but when silicon carbide is used, a high blocking voltage can be achieved by narrowing the channel width even if it is the normally-off type. That is because the built-in potential of a pn junction of silicon carbide is as high as about 2.5 V and the channel can be completely depleted without applying a negative voltage to the gate. Therefore, a high-performance device which is the normally-off type and does not depend on the oxide film interface can be achieved. Note that, Japanese Patent Application Laid-Open Publication No. 2004-134547 (Patent Document 1) discloses an example of a normally-off type silicon carbide junction FET. Meanwhile, generally, to achieve the normally-off type by a junction FET, it is necessary to set the channel length to be larger than or equal to about 1 µm and the channel width to be smaller than or equal to about 0.5 µm, and therefore, there is a problem still remained that the specific on-resistance becomes large as the resistance of the channel becomes large.

On the other hand, as means for reducing the channel resistance of the junction FET, an increase of concentration of the channel layer is cited. By increasing the impurity concentration of the channel to be higher than the impurity concentration of the drift layer, carriers in the channel are increased so that the channel resistance is reduced. Japanese Patent Application Laid-Open Publication (Translation of PCT Application) No. 2001-527296 (Patent Document 2) discloses a junction FET having an increased impurity concentration in the channel layer.

SUMMARY OF THE INVENTION

Meanwhile, in the case of employing an increase of concentration to the channel layer of a normally-off junction FET, the following problems exist.

One problem differs depending on whether a boundary between an n$^-$-type drift layer and an n-type channel layer is positioned deeper or shallower than a p$^+$-type gate layer. Herein, FIGS. 14 and 15 are cross-sectional views of an essential part of a normally-off junction FET including: an n$^-$-type drift layer 101; an n-type channel layer 102; a p$^+$-type gate layer 103; an n$^+$-type drain layer 104; an n$^+$-type source layer 105; a source electrode 106; and a drain electrode 107. FIG. 14 illustrates the case where the boundary between the drift layer and the channel layer is positioned deeper than the gate layer. FIG. 15 illustrates the case where the boundary between the drift layer and the channel layer is positioned shallower than the gate layer.

As illustrated in FIG. 14, when the boundary between the n$^-$-type drift layer 101 and the n-type channel layer 102 is positioned deeper than the p$^+$-type gate layer 103, a high-concentration pn junction is formed between the n-type channel layer 102 and the p$^+$-type gate layer 103 at a bottom portion of the p$^+$-type gate layer 103 and a corner portion being continuous from the bottom portion of the p$^+$-type gate layer 103, resulting in a lowering of the blocking voltage of the device. This lowering becomes significant as the impurity concentration of the n-type channel layer 102 becomes higher. On the other hand, as illustrated in FIG. 15, when the boundary between the n$^-$-type drift layer 101 and the n-type channel layer 102 is positioned shallower than the p$^+$-type gate layer 103, the channel width is narrower near an exit of the channel having a low concentration in the n-type channel layer 102, resulting in an occurrence of a distortion of the potential. Thereby, the potential of the channel becomes high at only a part of it, resulting in an increase of the channel resistance.

Also, since the channel length of the normally-off junction FET is long, it is preferable to grow an epitaxial layer having a high impurity concentration on the drift layer and forming the device on the epitaxial layer to make the impurity concentration of the channel layer high. However, in that case, there is a problem that the pn junction in a termination region for mitigating electric field provided in the periphery of the device has a high concentration, resulting in a lowering of the blocking voltage.

An object of the present invention is to provide a junction FET using silicon carbide as its base material and being capable of ensuring a blocking voltage and also preventing an increase of a channel resistance.

The above and other objects and novel characteristics of the present invention will be apparent from the description of the present specification and the accompanying drawings.

The typical ones of the inventions disclosed in the present application will be briefly described as follows.

A semiconductor device of the present invention includes:

a low-resistance semiconductor substrate of a first conductivity type to be a drain layer;

a first main electrode connected to a back surface of the low-resistance semiconductor substrate;

a first epitaxial layer of the first conductivity type formed on the low-resistance semiconductor substrate and having a high resistance;

a second epitaxial layer of the first conductivity type formed on the first epitaxial layer and having a lower resistance than the first epitaxial layer;

a plurality of first trenches formed in the second epitaxial layer;

a low-resistance source region of the first conductivity type formed in a region sandwiched between the first trenches on a surface of the second epitaxial layer;

a second main electrode formed on the low-resistance source region and electrically connected to the low-resistance source region;

a low-resistance gate region of a second conductivity type formed on a sidewall and a bottom portion of the first trench;

a third main electrode formed on the low-resistance gate region and electrically connected to the low-resistance gate region; and a high-resistance termination region of the second conductivity type formed to surround an active region including the first trench, the low-resistance source region, and the low-resistance gate region, wherein a channel region sandwiched between the low-resistance gate regions and formed of the second epitaxial layer has a channel width being constant in a first region that is relatively close to the low-resistance source region, and the channel width being wider toward the first epitaxial layer side in a second region that is relatively close to the first epitaxial layer, and a boundary between the first epitaxial layer and the second epitaxial layer is positioned within the second region and closer to a surface side of the high-resistance termination region than a pn junction position of a bottom portion of the high-resistance termination region.

The effects obtained by typical aspects of the present invention will be briefly described below.

Since the bottom of a high-concentration region to be a gate of a junction FET is positioned shallower than the bottom of a termination region, an extreme concentration of electric field can be prevented at a corner potion of an outer periphery of the termination region where an electric field tends to concentrate, so that a blocking voltage of the junction FET can be ensured.

Also, in a channel region of the junction FET, a boundary between a high-concentration region (channel region) and a drift region exists in a region in which a channel width becomes wider toward a drain side, so that the blocking voltage between the gate and drain of the junction FET can be ensured. Moreover, since the channel width does not become narrowest in the vicinity of the boundary between the high-concentration region and the drift region, an increase of a channel resistance can be prevented.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Also, in the embodiments, when the description about components and so forth noted "including A", "being composed of A", or "formed of A", it is needles to say that other elements than that mentioned are not eliminated unless otherwise particularly mentioned that the element is limited to particular one.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, when materials and the like are mentioned, the specified material is a main material and subsidiary elements, additives, additional elements, and the like are not eliminated unless otherwise particularly mentioned that the material is not a main material or the material is not a main material in principle or situationally.

Also, components having the same function are denoted by the same reference symbols throughout the drawings for describing the embodiments, and the repetitive description thereof is omitted.

Hereinafter, embodiments of the present invention will be described in detail with reference to the accompanying drawings.

First Embodiment

Figure 1:
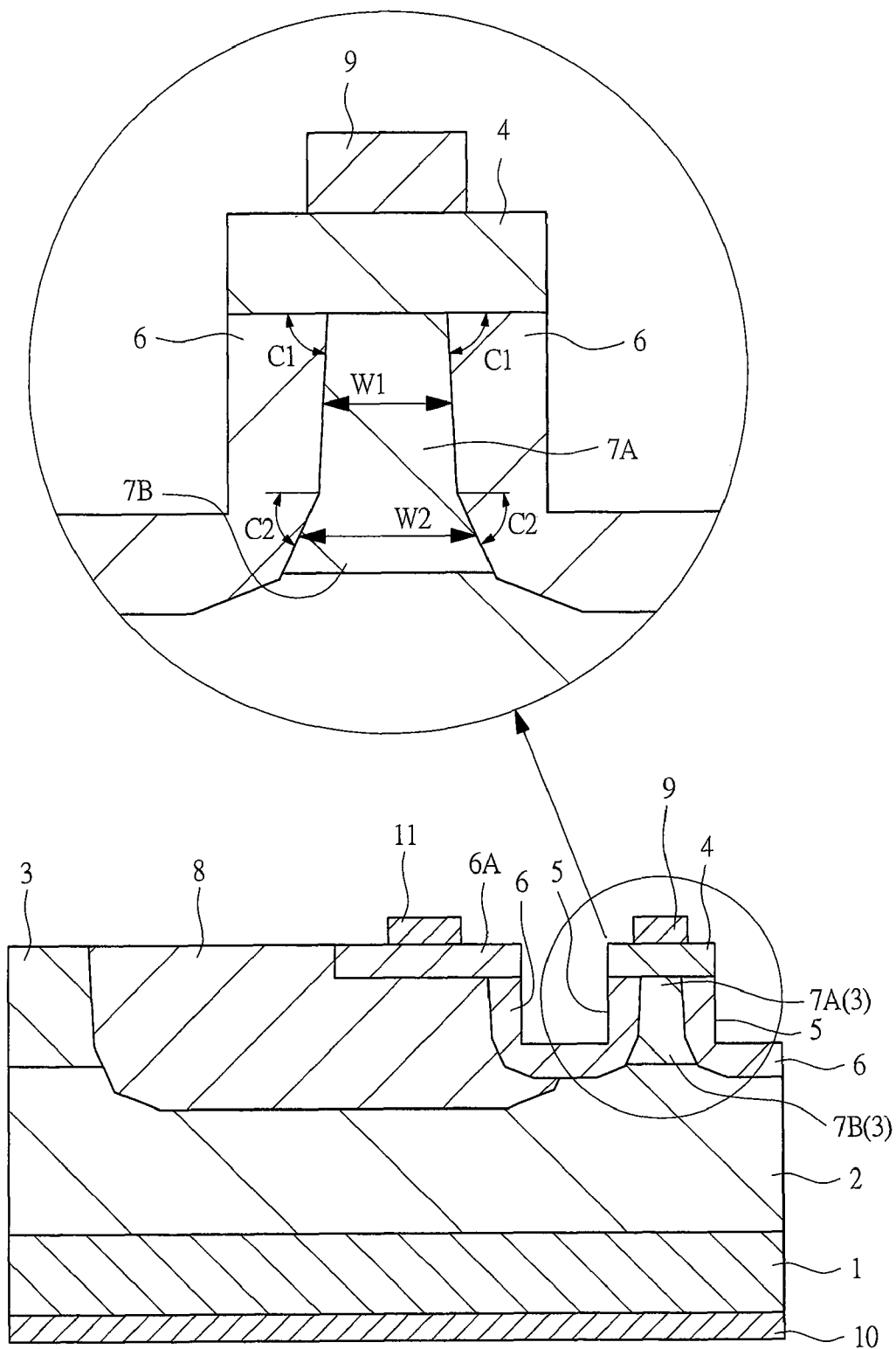
FIG. 1 is a cross-sectional view of an essential part of a structure of a semiconductor device according to a first embodiment of the present invention.

FIG. 1 illustrates a cross-sectional view of an essential part of a structure of a device including a normally-off junction FET, the device being a semiconductor device according to a first embodiment of the present invention, and further, a part of the device is enlarged.

As illustrated in FIG. 1, a first epitaxial layer 2 to be a drift layer made of $n^-$-type SiC, and a second epitaxial layer 3 to be a part of a channel made of SiC and having a concentration of an introduced impurity higher than that of the first epitaxial layer 2 are formed on a substrate (low-resistance semiconductor substrate) 1 to be a drain made of $n^+$-type (first conductivity type) SiC, and an active region and a termination region of the device are formed above the substrate 1. The active region is composed of an $n^+$-type source region (low-resistance source region) 4, and a $p^+$-type (second conductivity type) gate region (low-resistance gate region) 6 formed on a bottom portion and a sidewall of a trench (first trench) 5. A channel region sandwiched between the $p^+$-type gate regions 6 is separated into a region 7A having a channel width being constant, and a region 7B having a channel width becoming wider toward the drain (substrate 1) side. A boundary between the first epitaxial layer 2 and the second epitaxial layer 3 is positioned in the region 7B having the channel width becoming wider toward the drain (substrate 1) side. On the other hand, a termination region (high-resistance termination region) 8 is arranged to surround the active region to mitigate the electric field, and is p-type having a smaller impurity concentration than the $p^+$-type gate region 6, and having a pn junction positioned deeper than the $p^+$-type gate region 6. Therefore, a boundary between the first epitaxial layer 2 and the second epitaxial layer 3 is positioned shallower than the pn junction of the bottom part of the termination region 8.

Next, an operation of the junction FET according to the first embodiment will be described. First, in an ON state, a voltage of about 2.5 V is applied to the gate and a voltage of about 1 to 2 V is applied to the drain. In the first embodiment, since the impurity concentration of the channel region is higher than the drift layer ($n^-$-type first epitaxial layer 2), the channel resistance is low, and it makes a current in the ON state large. How the position of the boundary between the first epitaxial layer 2 and the second epitaxial layer 3 influences on the ON current will be explained with reference to schematic diagrams of potential illustrated in FIGS. 2 and 3.

Figure 2:
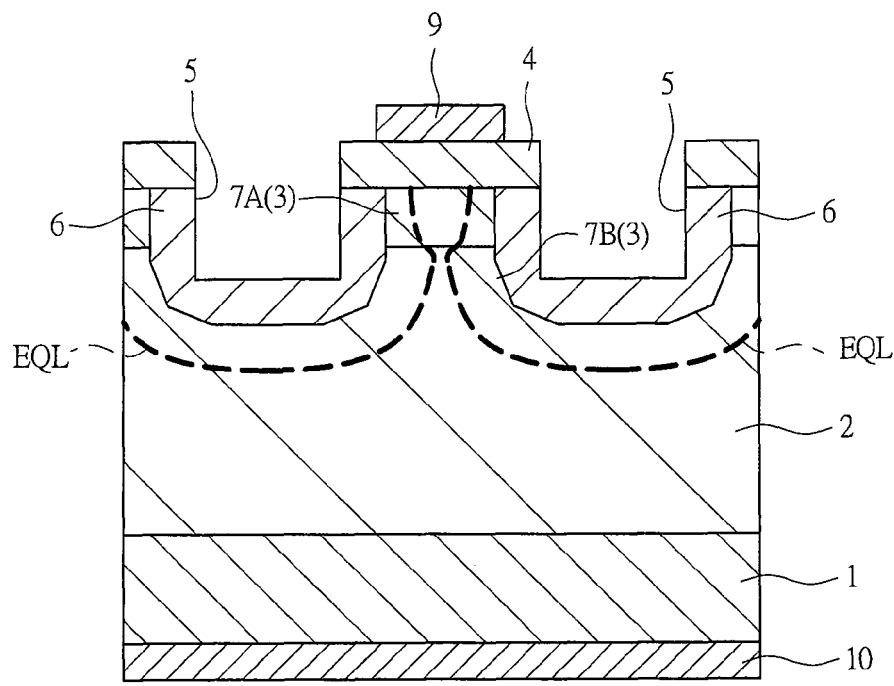
FIG. 2 is an explanatory diagram illustrating potential of a junction FET compared with a junction FET included in the semiconductor device of the first embodiment of the present invention by equipotential lines.
Figure 3:
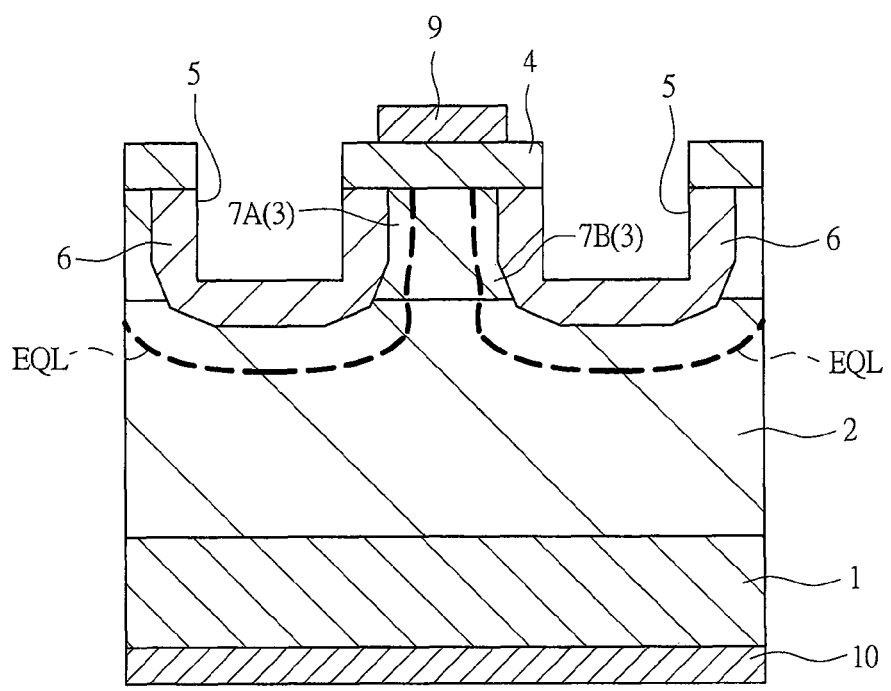
FIG. 3 is an explanatory diagram illustrating potential of the junction FET included in the semiconductor device of the first embodiment of the present invention by equipotential lines.

When the boundary between the first epitaxial layer 2 and the second epitaxial layer 3 is positioned within the region (first region) 7A in the channel region in which the channel width is constant (see FIG. 2), the potential (illustrated by equipotential lines EQL (dotted lines) in FIG. 2) is high in the region 7A in which the impurity concentration is relatively smaller than the region 7B, and thus current is difficult to flow. On the other hand, when the boundary between the first epitaxial layer 2 and the second epitaxial layer 3 is positioned within the region (second region) 7B in which the channel width becomes wider toward the drain (substrate 1) side or positioned deeper than the region 7B (see FIG. 3), distortion of the potential (illustrated by equipotential lines EQL (dotted lines) in FIG. 3) is small, and thus a drain current in the ON state is not lowered. That is, in the first embodiment, the channel resistance can be reduced without an influence of distortion of potential due to the increased impurity concentration in the channel region. At this time, when the channel width at the boundary between the first epitaxial layer 2 and the second epitaxial layer 3 is about 0.2 μm or more wider than the channel width in the region 7A in which the channel width is constant, the current is less subject to the distortion of potential.

Next, in an OFF state, a voltage of 0 V is applied to the gate, and a voltage of about several hundred to several thousand volts is applied to the drain. The blocking voltage of the junction FET is determined by the pn junction of the channel region and the $p^+$-type gate region 6 and the pn junction of the channel region and the termination region 8. At this time, when the boundary between the first epitaxial layer 2 and the second epitaxial layer 3 is positioned deeper than the pn junction position of the $p^+$-type gate region 6, the pn junction between the $p^+$-type gate region 6 and the channel region has a high impurity concentration, and thus the blocking voltage of the pn junction of the $p^+$-type gate region 6 is lowered, resulting in a lowering of the blocking voltage of the junction FET device. On the other hand, in the first embodiment, since the boundary between the first epitaxial layer 2 and the second epitaxial layer 3 is positioned within the channel region, the blocking voltage will not be lowered. In addition, as to the termination region 8 also, since the boundary between the first epitaxial layer 2 and the second epitaxial layer 3 is positioned shallower than the depth of the pn junction of the termination region 8, a local concentration of electric field to the deepest position of the corner of the termination region 8 can be mitigated, so that the blocking voltage of the junction FET device can be ensured.

In the first embodiment, a junction FET of the 600 V blocking voltage class is assumed, in which the impurity concentration of the drift layer (first epitaxial layer 2) is about $1 \times 10^{16}$ to $2 \times 10^{16}$ cm$^{-3}$, a thickness of the drift layer is about 6 to 8 μm, a depth of the trench 5 is about 1 to 1.5 μm, and a width of the trench is about 1 μm. Also, the impurity concentration of the second epitaxial layer 3 is preferable to be $3 \times 10^{16}$ to $5 \times 10^{16}$ cm$^{-3}$. That is because, since the channel width is made narrower to ensure the blocking voltage when the impurity concentration is increased while the lower channel resistance, the higher the impurity concentration of the second epitaxial layer 3, the sensitivity of the junction FET characteristics to the channel width becomes too high. Here, a channel width W1 in the region 7A and a channel width W2 in the region 7B are defined according to the impurity concentration ratio of the first epitaxial layer 2 and the second epitaxial layer 3. In the first embodiment, when the impurity concentration ratio is about 1:2, it is exemplified that the channel width W1 in the region 7A is about 0.3 μm, and the channel width W2 in the region 7B is about 0.5 μm.

In addition, in the region 7A in which the channel width is constant, it is preferable to have an angle C1 (see FIG. 1) of the pn junction surface forming the channel is about 87° to 90° with respect to the surface of the substrate 1. That is because the blocking voltage of the channel is lowered when the angle C1 of the pn junction surface forming the channel is smaller than 87°. Also, as to the region 7B in which the channel width becomes wider toward the drain side, it is preferable that an angle C2 of the pn junction surface (see FIG. 1) is about 30° to 60° with respect to the substrate 1, and a depth of the pn junction surface is about 0.5 μm or more, to make the distortion of potential small at the boundary between the first epitaxial layer 2 and the second epitaxial layer 3.

The same numeric values mentioned above can be employed for junction FETs of other classes, and the impurity concentration of the second epitaxial layer 3 may be about 1.5 to 3 times the concentration of the first epitaxial layer 2. That is because the current is lowered as the distortion of potential is large when the concentration difference is too large.

Next, a method of manufacturing the junction FET according to the first embodiment will be described with reference to FIGS. 4 to 7.

Figure 4:
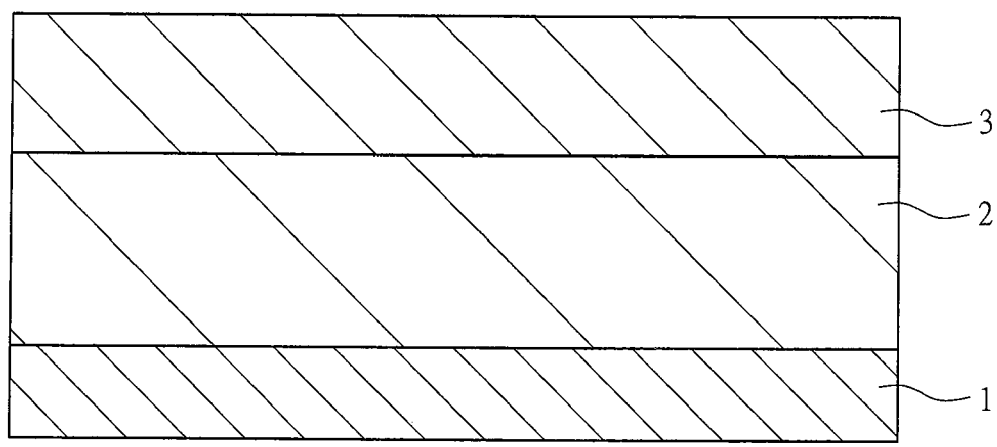
FIG. 4 is a cross-sectional view of an essential part describing a method of manufacturing the semiconductor device according to the first embodiment of the present invention.

First, as illustrated in FIG. 4, the n$^-$-type first epitaxial layer 2 to be the drift layer and the second epitaxial layer 3 to be a part of the channel are grown on the substrate 1 made of n$^+$-type SiC. As described above, the second epitaxial layer 3 is set to have a higher impurity concentration than the first epitaxial layer 2.

Figure 5:
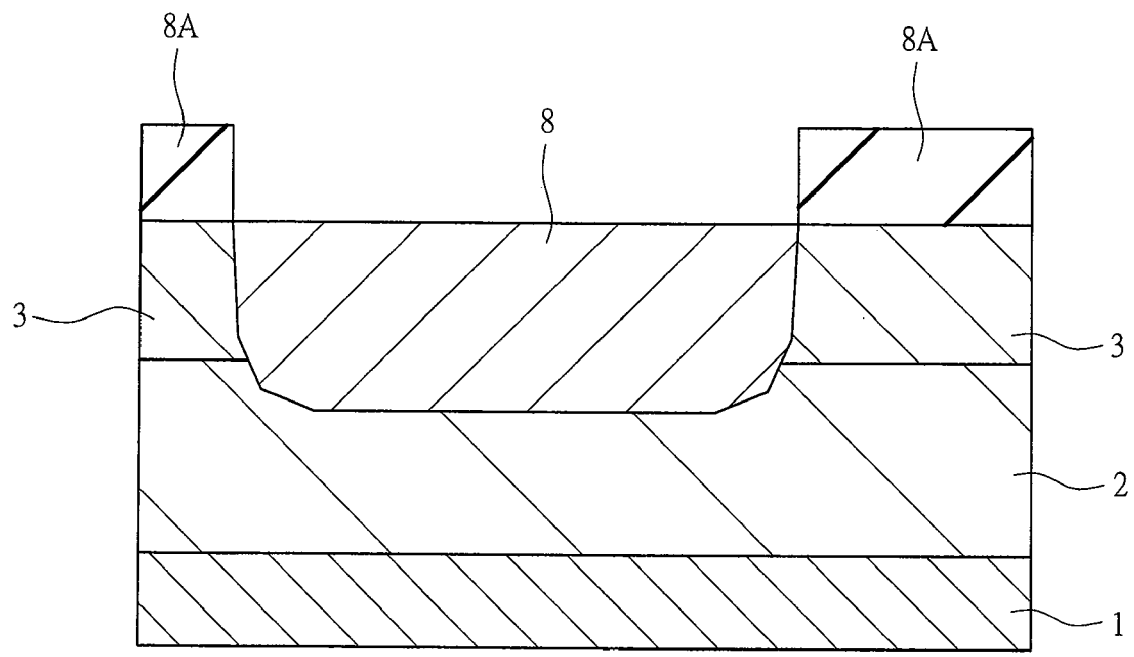
FIG. 5 is a cross-sectional view of the semiconductor device in a manufacturing process continued from FIG. 4.

Next, as illustrated in FIG. 5, the p-type termination region 8 is formed by photolithography technique and impurity ion implantation. At this time, since the energy of the ion implantation is high, it is preferable to use a hard mask of a silicon oxide film or the like as a mask 8A during the ion implantation. In addition, as ion species, boron or aluminum is preferable.

Figure 6:
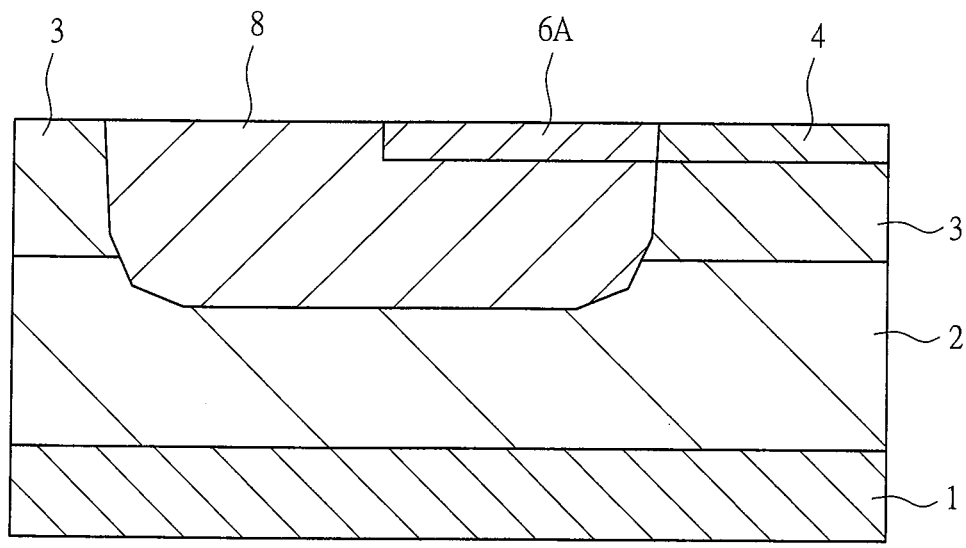
FIG. 6 is the cross-sectional view of the semiconductor device in the manufacturing process continued from FIG. 5.

Next, as illustrated in FIG. 6, the n$^+$-type source region 4, and the p$^+$-type gate connection region (low-resistance gate region) 6A to be a contact region of the gate of the junction FET are formed by photolithography technique and impurity ion implantation. A mask during the ion implantation may be a hard mask of a silicon oxide film or the like or a photoresist mask. Ion species of the ion implantation are preferable to be nitride during formation of the n$^+$-type source region 4, and aluminum during formation of the p$^+$-type gate connection region 6A to make the sheet resistance small. In addition, to ensure the gate blocking voltage, the ion implantation of the n$^+$-type source region 4 is preferable to be performed in a high-temperature atmosphere at about 500° C.

Figure 7:
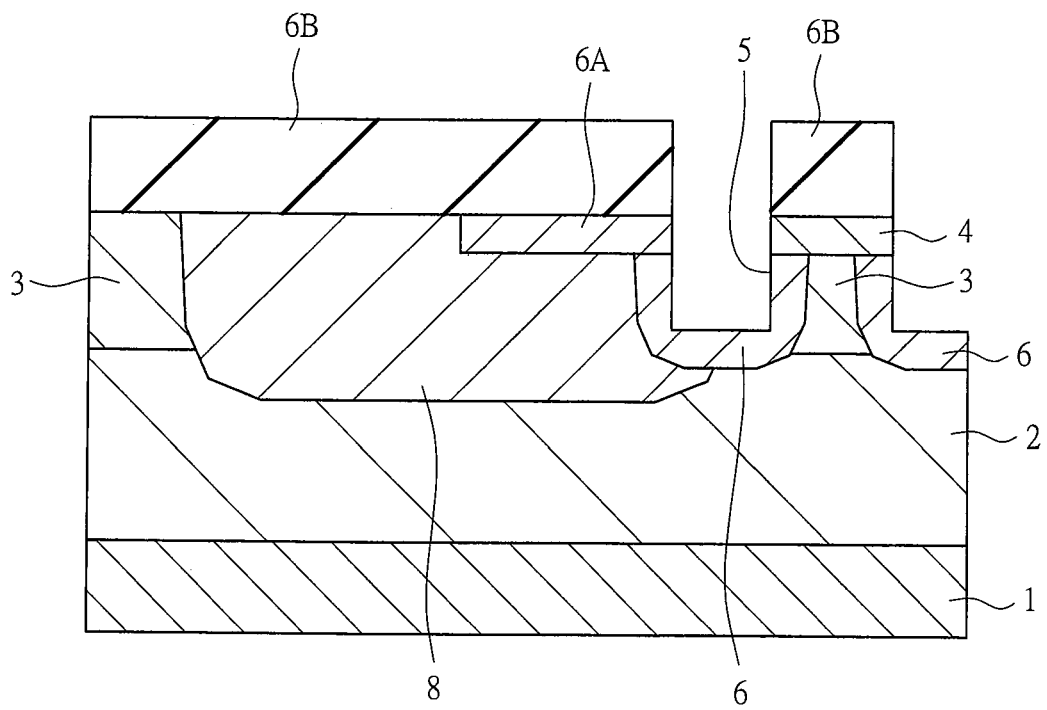
FIG. 7 is a cross-sectional view of the semiconductor device in the manufacturing process continued from FIG. 6.

Next, as illustrated in FIG. 7, the trench 5 is formed by photolithography technique and dry-etching technique. Next, the p$^+$-type gate region 6 to be the gate of the junction FET is formed on a side surface and a bottom portion of the trench 5 by impurity ion implantation. The p$^+$-type gate region 6 in the region 7A in which the channel width is constant (see FIG. 1) is formed on the sidewall of the trench 5 by inclined ion implantation having an inclination to the surface of the substrate 1. The p$^+$-type gate region 6 in the region 7B in which the channel width becomes wider toward the drain (substrate 1) side is formed by vertical ion implantation to the bottom portion of the trench 5. In the case of an inclined ion implantation, it is preferable to be multi-implantation having an ion implantation angle of about 20° to 30° angle of incident to the direction vertical to the surface of the substrate 1, and having the energy about 200 to 300 keV at maximum. On the other hand, in the region 7B in which the channel width becomes wider toward the drain side, it is preferable to be vertical implantation having the energy about 200 to 300 keV to set the depth of the pn junction at about 0.5 μm or more from the surface of the substrate 1. A mask 6B for forming the p$^+$-type gate region 6 is preferable to be a hard mask of a silicon oxide film or the like, and ion species are preferable to be aluminum.

Next, after performing an activation annealing at 1500° C. or higher to the substrate 1, the trench 5 is buried by, for example, a silicon oxide film (illustration omitted). Subsequently, an alloy film containing nickel as its main component is deposited on the two sides of the substrate 1, and then the alloy film is patterned by dry-etching, so that a source electrode (second main electrode) 9, a drain electrode (first main electrode) 10, and a gate electrode (third electrode) 11 are formed (see FIG. 1).

Then, an interlayer insulating film formed of a silicon oxide film or the like is deposited on the substrate 1, and the interlayer insulation film is etched to form contact holes reaching the source electrode 9 and the gate electrode 11, respectively. Next, plugs connected with the source electrode 9 and the gate electrode 11 are formed within the contact holes, respectively, and further, a wiring for connecting the plugs is formed on the interlayer insulating film, thereby manufacturing a semiconductor device including the junction FET according to the first embodiment. More multi-layered wirings can be formed by repeating the steps for forming the interlayer insulating film, plugs, and wiring.

Second Embodiment

Figure 8:
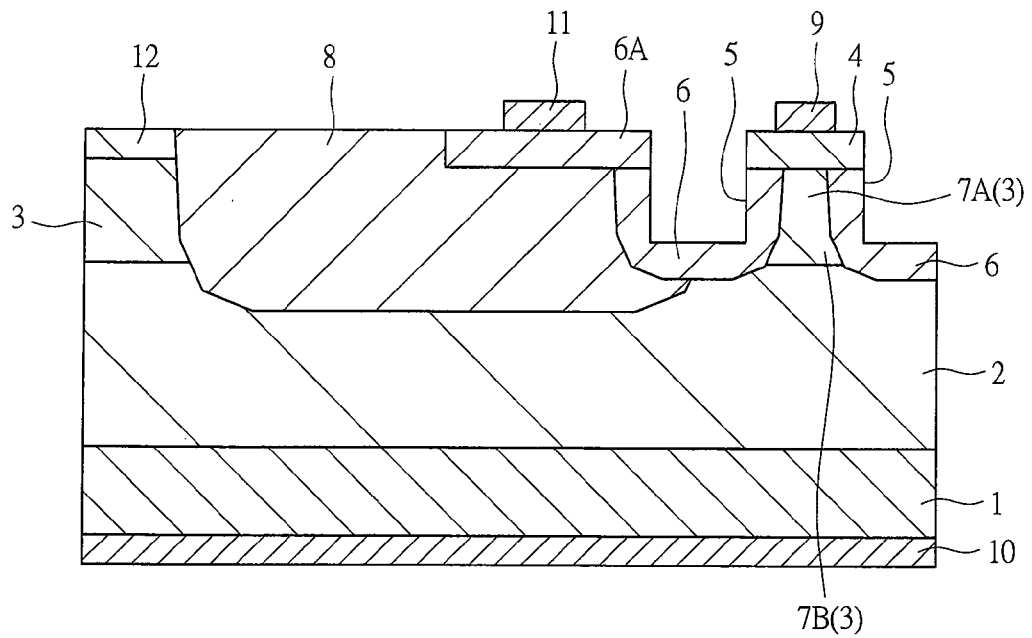
FIG. 8 is a cross-sectional view of an essential part of a structure of a semiconductor device according to a second embodiment of the present invention.

Next, a second embodiment will be described. FIG. 8 illustrates a cross-sectional structure of an essential part of a device including a junction FET, the device being a semiconductor device according to the second embodiment.

As illustrated in FIG. 8, a difference between the junction FET of the second embodiment and the junction FET of the first embodiment lies in that an n$^-$-type well layer (third epitaxial layer) 12 having a smaller impurity concentration than the second epitaxial layer 3 is formed on the second epitaxial layer 3. According to the second embodiment, the same effects can be obtained as the first embodiment in the active region.

As for the termination region 8, in the first embodiment, since the pn junction at the surface portion of the corner has a high impurity concentration while the pn junction at the deepest portion of the corner has a small impurity concentration among the deepest portion of the corner and the surface portion of the corner at which electric fields tends to concentrate, the electric field concentrates at the surface portion of the corner when the impurity concentration of the second epitaxial layer 3 is large, resulting in a lowering of the blocking voltage. On the other hand, in the second embodiment, since the impurity concentration is lowered by the n$^-$-type well layer 12 at the surface portion of the corner, the electric field will not concentrate also at the surface portion of the corner, and thus the blocking voltage can be further increased than the first embodiment.

The impurity concentration of the n$^-$-type well layer 12 at the surface portion of the corner of the termination region 8 is preferable to be about the same with the impurity concentration of the first epitaxial layer 2 that is the drift layer. Also, a thickness of the n⁻-type well layer 12 is preferable to be thinner than a thickness of the n⁺-type source region 4 not to influence characteristics of the active region.

While a method of manufacturing the junction FET according to the second embodiment is almost the same with that according to the first embodiment, only thing that is different is that the n⁻-type well layer 12 at the surface portion is formed after forming the second epitaxial layer 3. A method of forming the n⁻-type well layer 12 of the surface portion may be epitaxial growth, or implanting an impurity of p-type conductivity type to the whole surface of the second epitaxial layer 3 to lower the conductivity of n-type so that the substantial n-type impurity concentration at the surface of the second epitaxial layer 3 is lowered.

Third Embodiment

Figure 9:
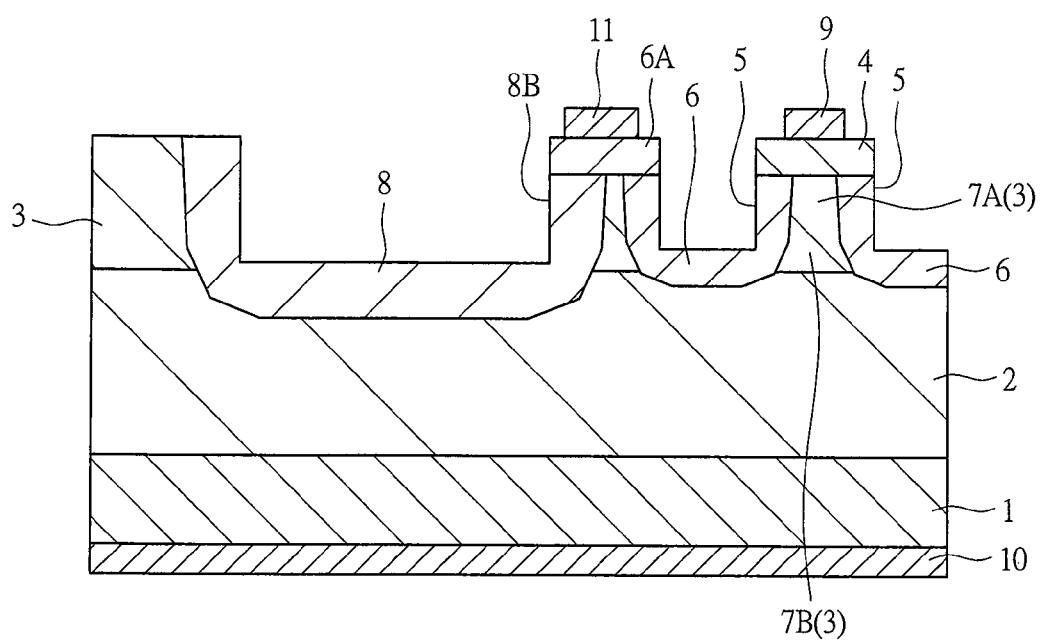
FIG. 9 is a cross-sectional view of an essential part of a structure of a semiconductor device according to a third embodiment of the present invention.

Next, a third embodiment will be described. FIG. 9 illustrates a cross-sectional structure of an essential part of a device including a junction FET, the device being a semiconductor device according to the third embodiment.

As illustrated in FIG. 9, a difference between the junction FET of the third embodiment and the junction FET of the first embodiment described above lies in that a trench (second trench) 8B is formed, and thereafter, the termination region 8 is formed to a sidewall and bottom portion of the trench 8B by low-energy impurity ion implantation.

According to the third embodiment, since high-energy impurity ion implantation is unnecessary for forming the termination region 8, there is an advantage of simplifying the impurity ion implantation process.

A method of forming the termination region 8 according to the third embodiment is exemplified by a process of forming the trench 8B by photolithography technique and dry-etching technique, and then forming the p-type termination region 8 by impurity ion implantation from a direction vertical to the surface of the substrate 1 and a direction having an inclination. Aluminum is preferable for ion species of the impurity ion. The energy of the impurity ion implantation is adjusted in consideration of a depth of the trench 8B to make the depth of the pn junction positioned deeper than the depth of the pn junction of the p⁺-type gate region 6 in the active region.

Fourth Embodiment

Figure 10:
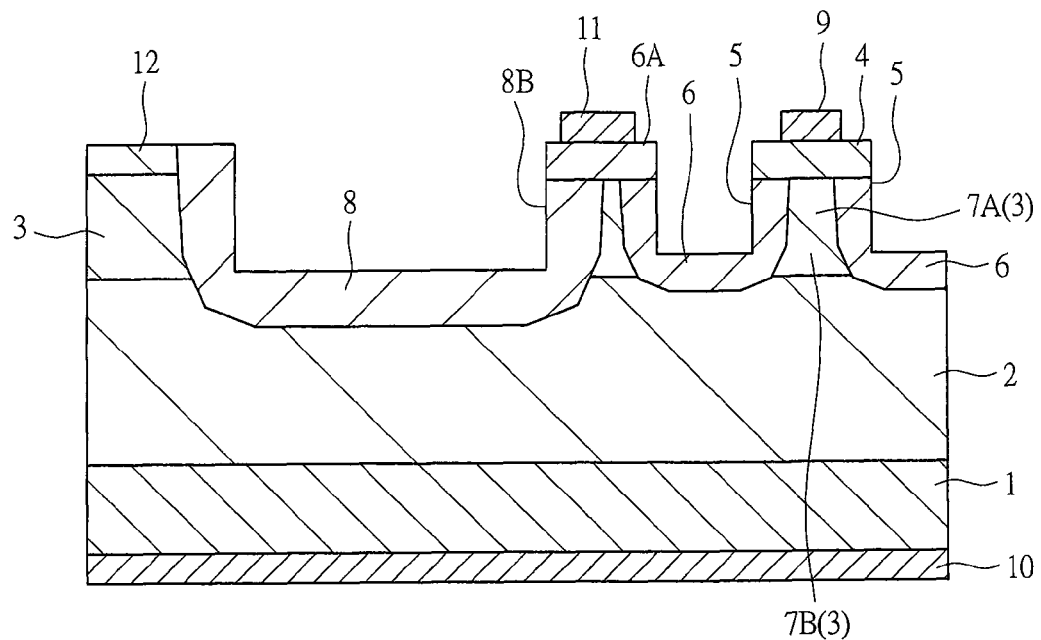
FIG. 10 is a cross-sectional view of an essential part of a structure of a semiconductor device according to a fourth embodiment of the present invention.

Next, a fourth embodiment will be described. FIG. 10 illustrates a cross-sectional structure of an essential part of a device including a junction FET, the device being a semiconductor device according to the fourth embodiment.

The fourth embodiment is composed by combining the second embodiment and the third embodiment described above. That is, as illustrated in FIG. 10, the n⁻-type well layer 12 described in the above-described second embodiment is added to the structure of the junction FET of the above-described third embodiment. In this manner, also in the structure of the junction FET according to the above-described third embodiment in which the trench 8B is provided in the termination region 8, the impurity concentration is lowered by the n⁻-type well layer 12, so that the impurity concentration in the surface portion of the corner of the termination region 8 is smaller than the second epitaxial layer 3, and thus the electric field will not concentrate at the surface portion of the corner, thereby further increasing the blocking voltage than the above-described third embodiment.

Fifth Embodiment

Figure 11:
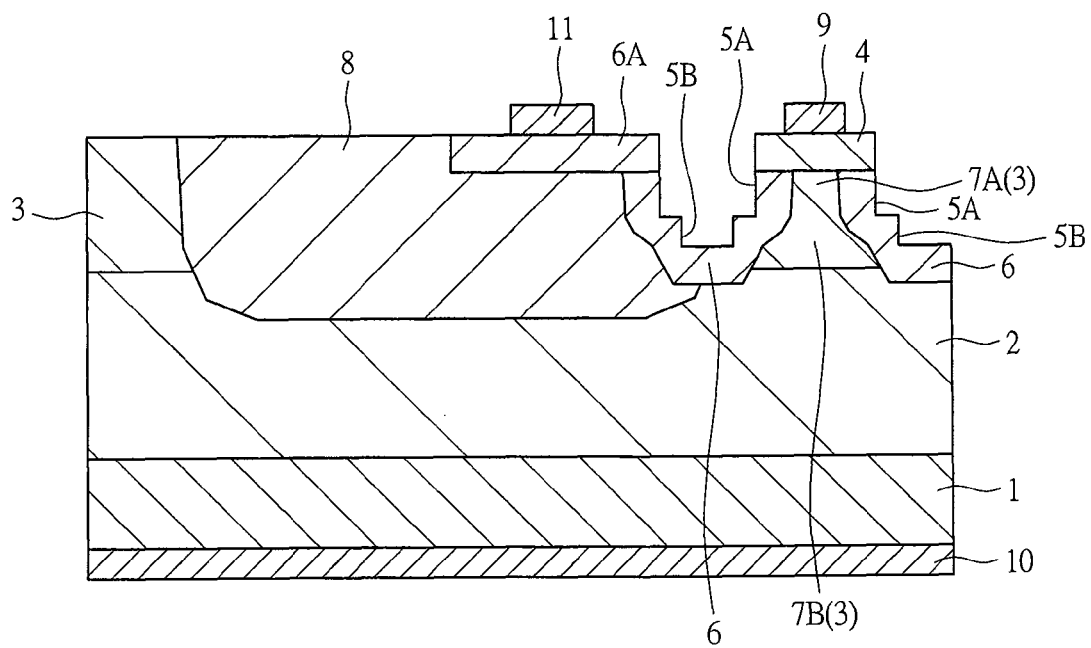
FIG. 11 is a cross-sectional view of an essential part of a structure of a semiconductor device according to a fifth embodiment of the present invention.

Next, a fifth embodiment will be described. FIG. 11 illustrates a cross-sectional structure of an essential part of a device including a junction FET, which is a semiconductor device according to the fifth embodiment.

Differences between the fifth embodiment and the above-described first to fourth embodiments are the structure of the region 7B in which the channel width is not constant, and the method of forming the region 7B. In the fifth embodiment, a trench (corresponding to the trench 5 in the above-described first to fourth embodiments) on the p⁺-type gate region 6 in the active region is formed to have a two-step structure having a trench (third trench) 5A and a trench (fourth trench) 5B so that the region 7B having the channel width which becomes wider toward the drain (substrate 1) side is made deeper. In this manner, a region in which the boundary between the first epitaxial layer 2 and the second epitaxial layer 3 can be arranged is increased, and the process margin can be increased.

In addition, there are other advantages in the point that the region 7B having the channel width becoming wider toward the drain side is deep. That is, since the region 7B having the channel width becoming wider toward the drain (substrate 1) side hardly increases the channel resistance because current diffuses, and moreover, the region 7B plays a role of suppressing invasion of potential in a blocking state with respect to the region 7A in which the channel width is constant, the blocking voltage of the junction FET of the fifth embodiment can be improved.

Next, with reference to FIGS. 12 and 13, a method of manufacturing the junction FET according to the fifth embodiment will be described. The method of manufacturing the junction FET according to the fifth embodiment is different from the method of manufacturing the junction FET of the above-described first embodiment in only steps of forming the trenches 5A and 5B and the p⁺-type gate region 6, and thus only the different point will be described.

Figure 12:
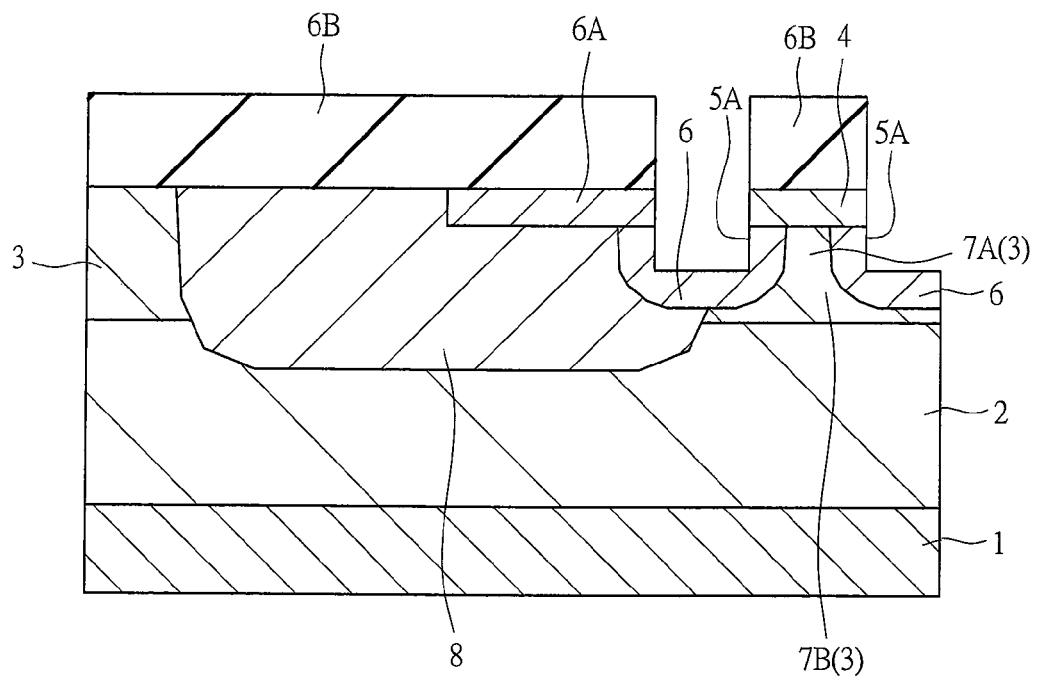
FIG. 12 is a cross-sectional view of an essential part describing a method of manufacturing the semiconductor device according to the fifth embodiment of the present invention.

First, as illustrated in FIG. 12, the trench 5A of the first step is formed by photolithography technique and dry-etching technique. Next, by the same step as the step of forming the p⁺-type gate region 6 in the above-described first embodiment, the p⁺-type gate region 6 is formed to a sidewall and a bottom portion of the trench 5A. At this time, as the same with the above-described first embodiment, the mask 6B is preferable to be a hard mask of a silicon oxide film or the like, and ion species are preferable to be aluminum.

Figure 13:
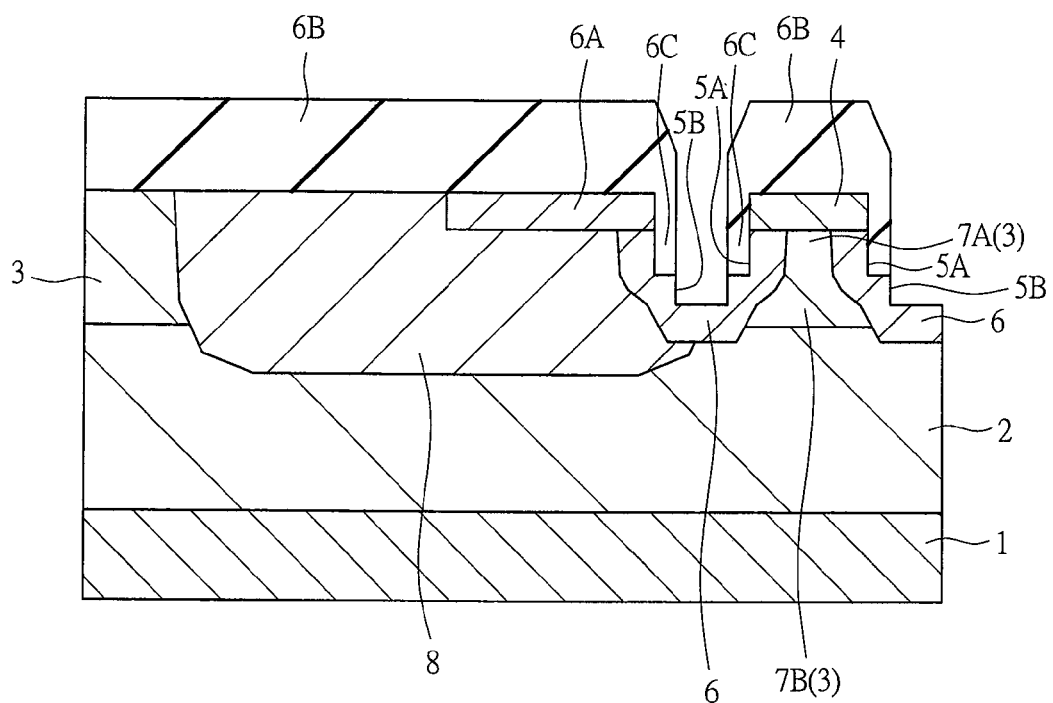
FIG. 13 is a cross-sectional view of the semiconductor device in a manufacturing process continued from FIG. 12.
Figure 14:
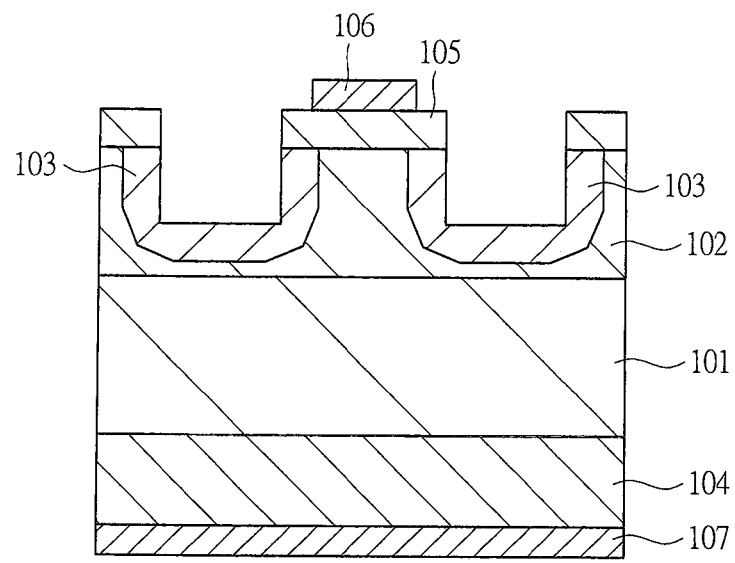
FIG. 14 is a cross-sectional view of an essential part of a semiconductor device including a normally-off junction FET, which has been studied by the inventors of the present invention.
Figure 15:
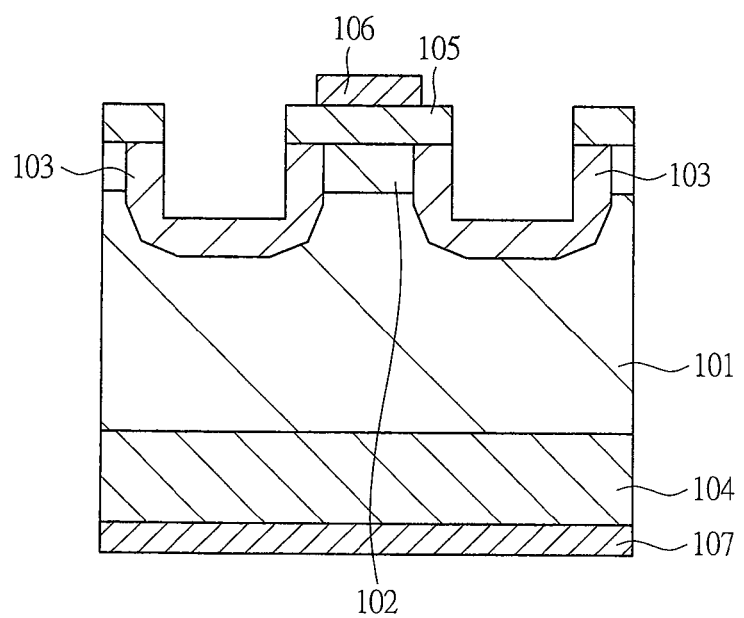
FIG. 15 is a cross-sectional view of the essential part of the semiconductor device including a normally-off junction FET, which has been studied by the inventors of the present invention.

Next, as illustrated in FIG. 13, an insulating film of a silicon oxide film or the like is additionally deposited on the mask 6B including the inside of the trench 5A, and the insulating film is etched-back, thereby forming a sidewall 6C to the sidewall of the trench 5A by the etch back. Subsequently, by dry-etching using the formed sidewall 6C as a mask, the trench 5B of the second step is formed to the bottom portion of the trench 5A. Subsequently, by implanting impurity ions to the sidewall and bottom portion of the trench 5B, the p⁺-type gate region 6 is extended to the sidewall and bottom portion of the trench 5B.

Steps thereafter are the same with those of the above-described first embodiment.

The trench 5A and the trench 5B of the two-step structure of the fifth embodiment as described above can be easily combined with the structure in which the impurity concentration in the surface portion of the corner of the termination region 8 is made smaller than the second epitaxial layer 4 by forming the n⁻-type well layer 12 to the surface of the second epitaxial layer 3, and the structure in which the trench 8B is provided to the termination region 8 as described in the second to fourth embodiments described above.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, while the above-described embodiments have been described about the case of using a junction FET using a substrate made of SiC, the junction FET can be used in the cases of using other wide-bandgap semiconductor substrates such as GaN (gallium nitride).

The semiconductor devices and the methods of manufacturing the semiconductor devices of the present invention can be used for a semiconductor device including a junction FET using, for example, silicon carbide as its base material and a method of manufacturing the semiconductor device.

What is claimed is:

1. A semiconductor device comprising:
a low-resistance semiconductor substrate of a first conductivity type to be a drain layer;
a first main electrode connected to a back surface of the low-resistance semiconductor substrate;
a first epitaxial layer of the first conductivity type formed on the low-resistance semiconductor substrate and having a high resistance;
a second epitaxial layer of the first conductivity type formed on the first epitaxial layer and having a lower resistance than the first epitaxial layer;
a plurality of first trenches formed in the second epitaxial layer;
a low-resistance source region of the first conductivity type formed in a region sandwiched between the first trenches on a surface of the second epitaxial layer;
a second main electrode formed on the low-resistance source region and electrically connected to the low-resistance source region;
a low-resistance gate region of a second conductivity type formed on a sidewall and a bottom portion of the first trench;
a third main electrode formed on the low-resistance gate region and electrically connected to the low-resistance gate region; and
a high-resistance termination region of the second conductivity type formed to surround an active region including the first trench, the low-resistance source region, and the low-resistance gate region, wherein
a channel region sandwiched between the low-resistance gate regions and formed of the second epitaxial layer has a channel width being constant in a first region that is relatively close to the low-resistance source region, and the channel width being wider toward the first epitaxial layer side in a second region that is relatively close to the first epitaxial layer, and
a boundary between the first epitaxial layer and the second epitaxial layer is positioned within the second region and closer to a surface side of the high-resistance termination region than a pn junction position of a bottom portion of the high-resistance termination region.

2. The semiconductor device according to claim 1, wherein the channel width at the boundary between the first epitaxial layer and the second epitaxial layer is wider than a channel width in the first region by 0.2 µm or more.

3. The semiconductor device according to claim 1, wherein a part of a surface side of the second epitaxial layer is formed of a third epitaxial layer of the first conductivity type having an impurity concentration lower than the second epitaxial layer.

4. The semiconductor device according to claim 3, wherein a thickness of the third epitaxial layer is smaller than that of the low-resistance source region.

5. The semiconductor device according to claim 1, wherein the high-resistance termination region is formed of a second trench formed to the second epitaxial layer and the first epitaxial layer, and a high-resistance semiconductor region of the second conductivity type formed to a sidewall and a bottom portion of the second trench.

6. The semiconductor device according to claim 1, wherein the first trench is formed of a third trench having a relatively large width, and a fourth trench having a relatively small width, and formed to a bottom portion of the third trench, and
the low-resistance gate region is formed to sidewalls and bottom portions of the third and fourth trenches.

7. The semiconductor device according to claim 1, wherein the low-resistance semiconductor substrate, the first epitaxial layer, the second epitaxial layer, and the third epitaxial layer are formed of silicon carbide or gallium nitride.

8. The semiconductor device according to claim 1, wherein an impurity concentration of the second epitaxial layer is 1.5 to 3 times an impurity concentration of the first epitaxial layer.

9. The semiconductor device according to claim 1, wherein a depth of the first trench is 1 to 1.5 µm.

10. The semiconductor device according to claim 9, wherein
a pn junction surface between the low-resistance gate region and the second epitaxial layer makes an angle of 87° to 90° to a surface of the low-resistance semiconductor substrate in the first region.

11. The semiconductor device according to claim 9, wherein
a pn junction surface between the low-resistance gate region and the second epitaxial layer makes an angle of 30° to 60° to a surface of the low-resistance semiconductor substrate in the second region, and
the second region is formed to have a depth of 0.5 µm or more from the surface of the low-resistance semiconductor substrate.

12. A method of manufacturing a semiconductor device, comprising the steps of:
(a) forming a high-resistance first epitaxial layer of a first conductivity type on a low-resistance semiconductor substrate of the first conductivity type;
(b) forming a second epitaxial layer of the first conductivity type having a lower resistance than the first epitaxial layer on the first epitaxial layer;
(c) forming a high-resistance termination region of a second conductivity type to the first epitaxial layer and the second epitaxial layer;
(d) forming a low-resistance source region of the first conductivity type to a surface of the second epitaxial layer; and
(e) forming a plurality of first trenches in the second epitaxial layer, and forming a channel region sandwiched between a low-resistance gate region of the second conductivity type and the low-resistance gate region to sidewalls and bottom portions of the plurality of first trenches, wherein the step (c) includes the steps of:
- (c1) forming a second trench to the second epitaxial layer and the first epitaxial layer; and
- (c2) forming a high-resistance semiconductor region to a sidewall and a bottom portion of the second trench, the high-resistance termination region is formed to surround an active region formed of the first trench, the low-resistance source region, and the low-resistance gate region, the channel region is formed to have a channel width being constant in a first region that is relatively close to the low-resistance source region, and to have a channel width being wider toward the first epitaxial layer side in a second region that is relatively close to the first epitaxial layer, and a boundary between the first epitaxial layer and the second epitaxial layer is formed to be at a position within the second region, and to be closer to a surface side of the high-resistance termination region than a pn junction position at a bottom portion of the high-resistance termination region.

13. The method of manufacturing a semiconductor device according to claim 12, wherein the low-resistance semiconductor substrate, the first epitaxial layer, and the second epitaxial layer are formed of silicon carbide or gallium nitride.

14. A method of manufacturing a semiconductor device, comprising the steps of:
- (a) forming a high-resistance first epitaxial layer of a first conductivity type on a low-resistance semiconductor substrate of the first conductivity type;
- (b) forming a second epitaxial layer of the first conductivity type having a lower resistance than the first epitaxial layer on the first epitaxial layer;
- (c) forming a high-resistance termination region of a second conductivity type to the first epitaxial layer and the second epitaxial layer;
- (d) forming a low-resistance source region of the first conductivity type to a surface of the second epitaxial layer; and
- (e) forming a plurality of first trenches in the second epitaxial layer, and forming a channel region sandwiched between a low-resistance gate region of the second conductivity type and the low-resistance gate region to sidewalls and bottom portions of the plurality of first trenches, wherein the first trench is formed of a third trench having a relatively large width, and a fourth trench having a relatively small width and formed to a bottom portion of the third trench, the step (e) includes the steps of:
- (e1) forming a plurality of the third trenches in the second epitaxial layer, and forming the low-resistance gate region to sidewalls and bottom portions of the plurality of third trenches; and
- (e2) forming the fourth trenches to bottom portions of the plurality of third trenches, and extending the low-resistance gate region to sidewalls and bottom portions of the fourth trenches, the high-resistance termination region is formed to surround an active region formed of the first trench, the low-resistance source region, and the low-resistance gate region, the channel region is formed to have a channel width being constant in a first region that is relatively close to the low-resistance source region, and to have a channel width being wider toward the first epitaxial layer side in a second region that is relatively close to the first epitaxial layer, and a boundary between the first epitaxial layer and the second epitaxial layer is formed to be at a position within the second region, and to be closer to a surface side of the high-resistance termination region than a pn junction position at a bottom portion of the high-resistance termination region.

15. The method of manufacturing a semiconductor device according to claim 14, wherein the low-resistance semiconductor substrate, the first epitaxial layer, and the second epitaxial layer are formed of silicon carbide or gallium nitride.

* * * * *